US005537348A

United States Patent [19]
Shou et al.

[11] Patent Number: 5,537,348
[45] Date of Patent: Jul. 16, 1996

[54] MEMORY DEVICE

[75] Inventors: Guoliang Shou; Sunao Takatori; Makoto Yamamoto, all of Tokyo, Japan

[73] Assignee: Yozan Inc., Tokyo, Japan

[21] Appl. No.: 396,618

[22] Filed: Mar. 1, 1995

Related U.S. Application Data

[62] Division of Ser. No. 100,176, Aug. 2, 1993.

[30] Foreign Application Priority Data

Aug. 5, 1992 [JP] Japan .................................. 4-229260

[51] Int. Cl.$^6$ .................................................. G11C 11/40
[52] U.S. Cl. ............................ 365/174; 365/177; 365/63; 365/72
[58] Field of Search .............................. 365/174, 180, 365/189.01, 177, 63, 72

[56] References Cited

U.S. PATENT DOCUMENTS

| 3,473,149 | 10/1969 | Ashley | 365/174 |
| 4,366,554 | 12/1982 | Aoki et al. | 365/155 |
| 4,387,445 | 6/1983 | Denis et al. | 365/179 |
| 4,646,268 | 2/1987 | Kuno | 365/179 |
| 4,675,846 | 6/1987 | Jordy et al. | 365/174 |
| 4,882,706 | 11/1989 | Sinclair | 365/180 |
| 4,922,411 | 5/1990 | Hobbs | 365/174 |
| 4,943,740 | 7/1990 | Gulczynski | 307/454 |
| 5,117,391 | 5/1992 | Hwang et al. | 365/155 |

FOREIGN PATENT DOCUMENTS 1949406  9/1969  Germany .

OTHER PUBLICATIONS

Pricer, David, "Integrated Circuits (RAM, ROM)," The Electrical Engineering Handbook, Editor–In–Chief, Richard Dor, CRC Press, 1993, pp. 1651–1657.
Patent Abstracts of Japan, vol. 001, No. 136, 10 Nov. 1977 & JPP–A–51 120 141 (Tokyo Shibaura Electric).

*Primary Examiner*—Viet Q. Nguyen
*Attorney, Agent, or Firm*—Cushman, Darby & Cushman

[57] ABSTRACT

A memory device that does not need to be refreshed and that has a relatively small size. The memory device includes a memory cell having a first PNP transistor, wherein an input voltage is provided to its base and its emitter is ground and a second NPN transistor having its base connected to the collector of the first transistor and its emitter connected to a power source, and wherein the collector of the second transistor is connected to the base of the first transistor.

3 Claims, 1 Drawing Sheet

MEMORY DEVICE

This is a division of application Ser. No. 08/100,176, filed Aug. 2, 1993.

BACKGROUND OF THE INVENTION

1. Field of the Invention

The present invention relates to a memory device, and in particular, to a memory device that does not need to be refreshed.

2. Description of the Art

Conventionally, a static RAM includes a memory cell made from a flip-flop. However, there are problems in that the size of such a conventional circuit is rather large, the memory capacity is small and it is expensive to make using flip-flop.

SUMMARY OF THE INVENTION

The present invention solves the above-mentioned problems of the prior art memory devices and has an object to provide a memory device without the necessity of refreshment, wherein the circuit is small in size. The memory device of this invention comprises a self-holding circuit formed by a couple of transistors.

DETAILED DESCRIPTION OF THE PREFERRED EMBODIMENT OF THE PRESENT INVENTION

Hereinafter, the present invention is described with reference to the attached drawings.

Figure 1:
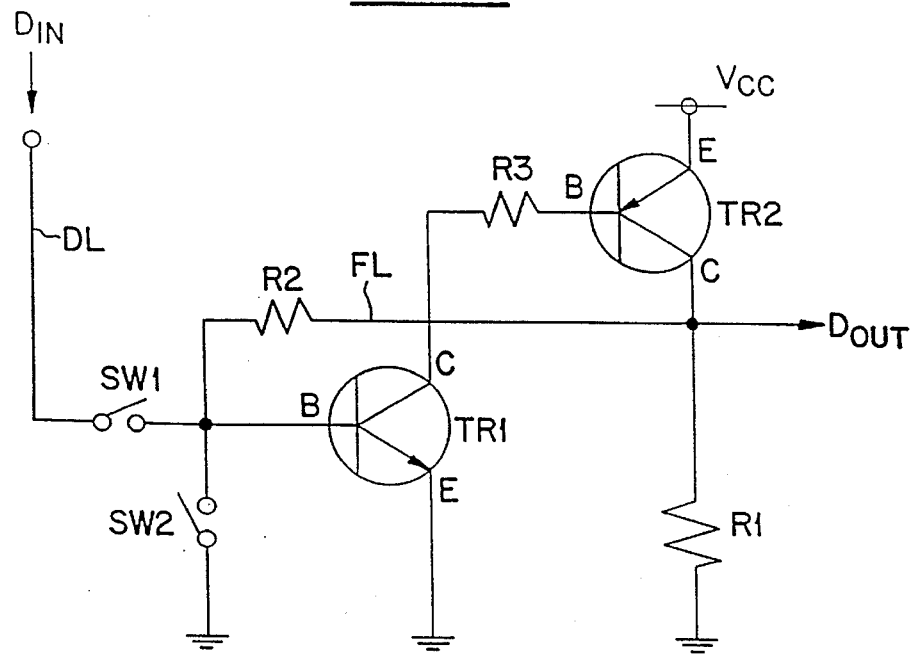
FIG. 1 shows a circuit according to a first embodiment of this invention.

FIG. 1 shows one memory cell in a memory device. The memory device according to the embodiment illustrated in FIG. 1 forms a self-holding circuit that includes a first NPN transistor TR1 and a second PNP transistor TR2.

The base of transistor TR1 is connected to a data line DL through a switch SW1 which is opened and closed by an address control (not shown). When data "Din" is at a high level, switch SW1 is closed, then the gate voltage of transistor TR1 is set to a high level and the transistor TR1 is conductive. Collector "C" of transistor TR1 is connected to the base of the second transistor TR2, and emitter "E" of transistor TR1 is grounded. Therefore, when transistor TR1 is conductive, the base of transistor TR2 is set to a low level and transistor TR2 is conductive. Emitter "E" of transistor TR2 is connected to power source "Vcc" and collector "C" of transistor TR2 is grounded. The electric voltage of the collector "C" rises under conduction.

The collector "C" of transistor TR2 is connected to the base "B" of transistor TR1 through conductor "FL". Even when switch SW1 is opened after transistor TR1 is once conductive, transistor TR1 remains conductive due to the electric voltage of collector "C". Thus, the circuit in FIG. 1 forms a self-holding circuit. The electric voltage of collector "C" is output as output data "Dout". The collector "C" of transistor TR2 is grounded through a high resistance "R1", which maintains the level of "Dout".

A grounded reset switch SW2 is connected to the base of transistor TR1 in order to reset the memory cell once in high level back to a low level. When reset switch SW2 is closed, the base of transistor TR1 is grounded and transistor TR1 is shut off. A protection resistance R2 is provided on the conductor FL so as to prevent large levels of electric current from being passed to transistor TR2 when reset switch SW2 is closed. Protecting resistance R3 is set between collector "C" of transistor TR1 and base "B" of transistor TR2 so as to protect transistor TR1 in a conductive state of transistor TR1.

In this way, it is possible to construct a memory cell without the necessity of refreshment and to realize a memory device having a small-size and constructed from a couple to transistors.

Figure 2:
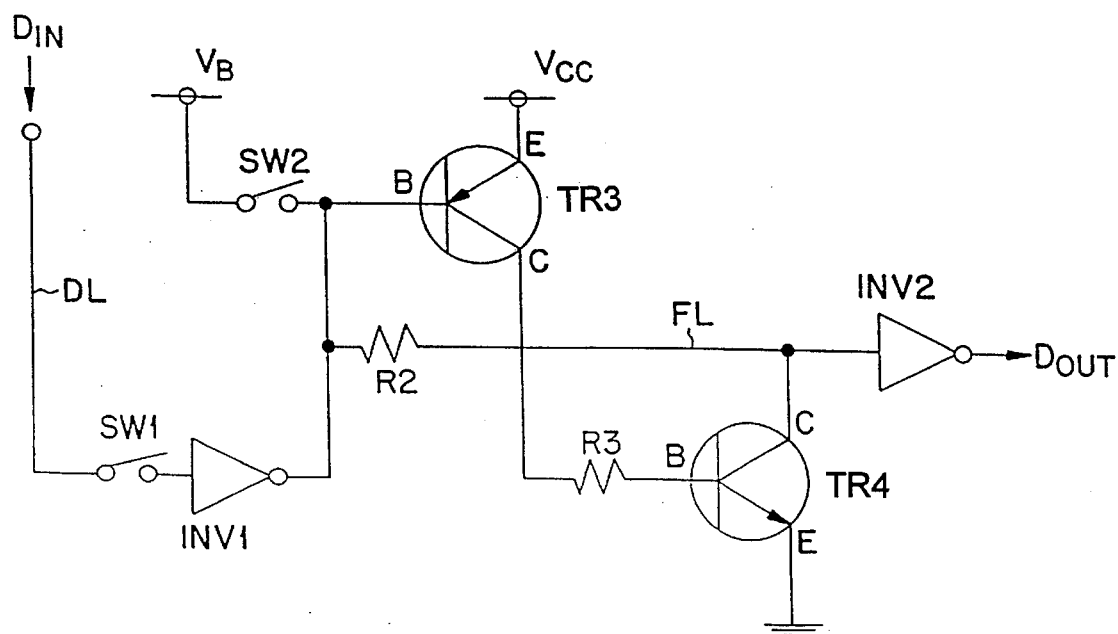
FIG. 2 shows a circuit according to a second embodiment of this invention.

FIG. 2 shows a memory circuit according to a second embodiment of this invention. The same parts as those illustrated in the circuit of FIG. 1 are given the same alphabetical symbols. In this embodiment, the first transistor TR3 is PNP type and the second transistor TR4 is NPN type. Data "Din" is input to transistor TR3 through inverter "INV1" and transistor "TR1" is reset by reset switch SW2 connected to a power source "$V_B$". As in FIG. 1, a protective resistance R3 is connected between collector "C" of transistor "TR3" and base "B" of transistor "TR4".

Emitter "E" of transistor "TR3" is connected to power source "$V_{CC}$" and collector "C" of transistor TR3 is connected to the base of transistor "TR4". When high level data Din is input to inverter INV1 through switch SW1, a low level of electric voltage is impressed on the base of transistor TR3 and transistor TR4 is conductive. Then, a high level of electric voltage of power source $V_{CC}$ is impressed on the base of transistor TR2 and transistor TR4 is made conductive. The emitter of transistor TR4 is grounded: when it is conductive, collector "C" is at a low level.

The collector "C" of transistor TR4 is connected to the base "B" of transistor TR3 through conductor "FL", and the electric voltage of the base of TR3 is kept low level during conduction of transistor TR4. Therefore, the state of transistors TR3 and TR4 is maintained unchanged. Inverter INV2 is connected to the collector C of transistor TR4. The output of inverter INV2 corresponds to the output data of Dout. Protective resistance "R2" is provided on conductive FL, which prevents large levels of electric current from power source $V_B$ from passing to transistor TR2 during reset.

It is possible to realize a memory device without the necessity of refreshment comprising a small size circuit.

As mentioned above, because a memory device of this invention forms a self-holding circuit using only a couple of transistors, it is not necessary to be refreshed and has a small size.

What is claimed is:

1. A memory cell in a memory device including a power supply, said memory cell comprising:

i) an input terminal receiving an input voltage;

ii) an inverter for inverting said input voltage;

iii) a first PNP transistor having an emitter operatively connected to said power supply, a collector and a base, said base receiving said inverted input voltage;

iv) a second NPN transistor having a base operatively connected to said collector of said first PNP transistor, an emitter operatively connected to ground, and a collector operatively connected to said base of said first PNP transistor; and v) a switching arrangement selectively operatively connecting said input terminal and said base of said first PNP transistor.

2. A memory cell according to claim 3, further comprising a protecting resistor disposed between said collector of said first PNP transistor and said base of said second NPN transistor.

3. A memory cell according to claim 1, further comprising a first inverter operatively connected to said collector of said second NPN transistor, wherein an output of said first inverter constitutes an output of said memory device.

* * * * *